US009175420B2

(12) United States Patent
Andreaco et al.

(10) Patent No.: US 9,175,420 B2
(45) Date of Patent: *Nov. 3, 2015

(54) SUPPRESSION OF CRYSTAL GROWTH INSTABILITIES DURING PRODUCTION OF RARE-EARTH OXYORTHOSILICATE CRYSTALS

(75) Inventors: Mark S. Andreaco, Knoxville, TN (US); A. Andrew Carey, Lenoir City, TN (US); Piotr Szupryczynski, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 8 days.

This patent is subject to a terminal disclaimer.

(21) Appl. No.: 12/894,494

(22) Filed: Sep. 30, 2010

(65) Prior Publication Data

US 2012/0080645 A1    Apr. 5, 2012

(51) Int. Cl.
*C30B 29/34*    (2006.01)
*C30B 15/00*    (2006.01)

(52) U.S. Cl.
CPC ................ *C30B 29/34* (2013.01); *C30B 15/00* (2013.01)

(58) Field of Classification Search
CPC ........... C09K 11/7734; C09K 11/7774; C09K 11/7792; C09K 11/7706; C09K 11/7721; C09K 11/7766; C09K 11/7769; C09K 11/7703; C09K 11/7749; C09K 11/7768; C09K 11/576; C30B 15/00; C30B 29/34; G01T 1/20
USPC ........................ 252/301.18, 301.17, 301.4 R; 250/370.11, 370.12
See application file for complete search history.

(56) References Cited

U.S. PATENT DOCUMENTS

| 6,278,832 | B1 * | 8/2001 | Zagumennyi et al. | ......... 385/141 |
| 2003/0021312 | A1 * | 1/2003 | Gruzdev et al. | ................. 372/39 |
| 2003/0094889 | A1 * | 5/2003 | Imamura et al. | .............. 313/486 |
| 2004/0017154 | A1 * | 1/2004 | Ito et al. | ......................... 313/582 |
| 2006/0288926 | A1 | 12/2006 | Kurata et al. | |
| 2007/0001773 | A1 * | 1/2007 | Oxborrow | ..................... 331/154 |
| 2007/0035813 | A1 * | 2/2007 | Roth et al. | ..................... 359/350 |
| 2007/0292330 | A1 | 12/2007 | Kurata et al. | |
| 2008/0089824 | A1 | 4/2008 | Shimura et al. | |
| 2011/0038947 | A1 * | 2/2011 | Maurer et al. | ................. 424/600 |
| 2011/0050090 | A1 * | 3/2011 | Lee et al. | ....................... 313/504 |
| 2011/0089580 | A1 * | 4/2011 | Hawker et al. | ................ 257/791 |

FOREIGN PATENT DOCUMENTS

| CN | 1250526 A | 4/2000 |
| DE | 69105710 | 9/1995 |
| KR | 1019950004195 B1 * | 4/1995 |

OTHER PUBLICATIONS

Machine translation of KR1019950004195B1 (note that the English title of the patent is "A green emission florescent substance and a cathode ray tube using this substance"), received Oct. 28, 2014.*
C.D. Brandle et al., "Effects of Impurities and Atmosphere on the Growth of Cr-Doped Gadolinium Scandium Gallium Garnet. I," Journal of Crystal Growth 85, pp. 223-228, 1987.
V.J. Fratello et al., "Effects of Impurities and Atmosphere on the Growth of Cr-Doped Gadolinium Scandium Gallium Garnet. II," Journal of Crystal Growth 85, pp. 229-233, 1987.
Office action in German Patent Application No. 102011115149.8 dated Jul. 3, 2013 (English translation attached).
CN Office Action dated Apr. 28, 2015 in CN Application No. 20110292339.X, 15 pages, English translation attached.

* cited by examiner

*Primary Examiner* — Matthew E Hoban
*Assistant Examiner* — Lynne Edmondson
(74) *Attorney, Agent, or Firm* — Peter Kendall

(57) ABSTRACT

Disclosed are a method of growing a rare-earth oxyorthosilicate crystal and a crystal grown using the method. A melt is prepared by melting a first substance including at least one rare-earth element and a second substance including at least one element from group 7 of the periodic table. A seed crystal is brought into contact with the surface of the melt and withdrawn to grow the crystal.

20 Claims, 5 Drawing Sheets

SUPPRESSION OF CRYSTAL GROWTH INSTABILITIES DURING PRODUCTION OF RARE-EARTH OXYORTHOSILICATE CRYSTALS

FIELD OF INVENTION

This application relates to the growth of crystals.

BACKGROUND

In some methods for growing crystals, such as the Czochralski method, a seed crystal is brought into contact with the surface of a melt and then withdrawn from the melt. A crystal grows on the seed as it is withdrawn. The seed and growing crystal are sometimes also rotated about a vertical axis as they are withdrawn. Growth instabilities often occur in large crystals grown using this technique. As an example, the crystal may begin to grow in a spiral shape instead of a desired cylindrical shape. Growth instabilities may result in stresses due to variations in thermal expansion coefficients within the crystal, that may cause the crystal to shatter. Growth instabilities may be caused by accumulation of impurities in the melt, changes in the charge states of some of the melt constituents leading to creation of different molecular complexes, as well as by excesses of melt constituents accumulating at the interface between the surface of the melt and the growing crystal.

SUMMARY

Disclosed is a method of growing a rare-earth oxyorthosilicate crystal. The method comprises preparing a melt by melting a first substance comprising at least one rare-earth element and melting a second substance comprising at least one element from group 7 of the periodic table. The method also includes providing a seed crystal, contacting the surface of a melt with the seed crystal, and withdrawing the seed crystal from the melt.

A composition is disclosed comprising a rare-earth oxyorthosilicate crystal, the rare-earth oxyorthosilicate crystal grown by preparing a melt by melting a first substance comprising at least one rare-earth element and melting a second substance comprising at least one element from group 7 of the periodic table, providing a seed crystal, contacting the surface of a melt with the seed crystal, and withdrawing the seed crystal from the melt.

A scintillation crystal is disclosed comprising a composition described by $L_{2x}A_{2y}R_{2(1-x-y)}SiO_5$, where R represents at least one first rare-earth element, L represents at least one second rare-earth element distinct from the first rare-earth element, and A represents at least one group 7 element.

DETAILED DESCRIPTION

In an embodiment, a melt is provided comprising a melted substance that includes at least one element from group 7 of the periodic table (IUPAC notation). The melt may suppress growth instabilities during the growth of oxyorthosilicate crystals grown from the melt using, for example, a Czochralski method. Group 7, also known as transition metals, includes the elements manganese (Mn) and rhenium (Re).

The addition of Mn to a melt including a melted first substance that includes at least one first rare-earth element may result in significant reduction in growth instabilities in rare-earth oxyorthosilicate crystals grown as boules from such a melt using the steps of providing a seed crystal, contacting the surface of the melt with the seed crystal, and withdrawing the seed crystal from the melt. An example of a crystal growing method including these steps is known as a Czochralski method. Oxyorthosilicate crystal boules grown from melts including at least one element from group 7 may have superior scintillation performance compared to crystals grown from similar melts not including an element from group 7. Using crystals formed by the methods herein, the intensities of emitted light from scintillator crystals sliced from different locations along the length of the boule may show greater uniformity from top to bottom of the boule, as explained below. In addition, the overall scintillation efficiency—the amount of light emitted from the crystal when a sufficiently energetic charged particle or photon with a specific energy is absorbed in the crystal—may be greater for such rare-earth oxyorthosilicate crystals than for equivalent crystals grown without an element from group 7. In addition, energy resolution of the crystal may be made better by the addition of an element from group 7 to the melt.

Figure 1:
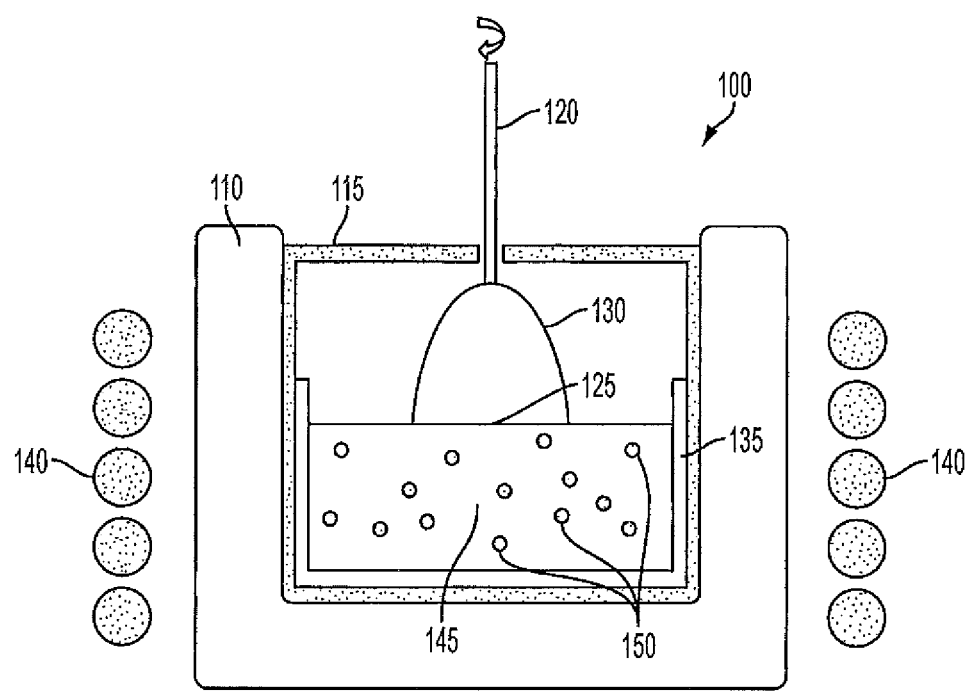
FIG. 1 shows an example apparatus for growing a crystal.

FIG. 1 shows an embodiment of a crystal-growing apparatus 100 including a melt 145. Melt 145 may be made by melting a first substance that includes at least one first rare-earth element, and a second substance that includes at least one element 150 from group 7 of the periodic table. Alternatively, the at least one rare-earth element and the at least one group 7 element may both be included in one substance. The first substance may be an oxide of the first rare-earth element. Melt 145 may also include melted stoichiometric $SiO_2$ (silica) or another silicon oxide. Melt 145 may also include a melted third substance that includes a second rare-earth element distinct from the first rare-earth element.

Melt 145 may include a melted fourth substance comprising at least one additional element distinct from the first rare-earth element or elements. Additional elements may be lutetium (Lu), gadolinium (Gd), lanthanum (La), or yttrium (Y) in any combination.

Melt 145 may include a melted fifth substance comprising at least one element from group 2 of the periodic table. Group 2, also known as alkaline earth metals, includes the elements beryllium (Be), magnesium (Mg), calcium (Ca), strontium (Sr), and barium (Ba).

Melt 145 may be contained in a crucible 135, which may be made of iridium. Crucible 135 is contained in an enclosure 115. Enclosure 115 may be utilized to control the ambient atmosphere above the melt surface in which a rare-earth oxyorthosilicate crystal is growing as a crystal boule 130. Surrounding enclosure 115 is a thermally insulating material 110. Melt 145 is maintained in a molten state by surrounding heating coils 140. Crystal boule 130 grows at or near an interface 125 between a portion of the boule that is already grown and a surface of melt 145. Growth of crystal boule 130 is initiated by attaching a seed crystal (not shown) to a rod 120. Rod 120 is slowly lifted upward as crystal growth proceeds. Rod 120 may also be rotated, as indicated by an arrow. Although the arrow indicates rotation of rod 120 in a clockwise direction as seen from above, rod 120 may also be rotated counterclockwise as seen from above.

The addition of group 7 element 150 to melt 145 may result in reduction of growth instabilities and in superior scintillation properties of the grown crystal boule 130, as described below. Melt 145 may include a melted third substance that includes a second rare-earth element. The second rare-earth element may be, but is not limited to, cerium (Ce). The second rare-earth element may be incorporated into crystal boule 130. The second rare-earth element may be incorporated into crystal boule 130 as a dopant. It may be incorporated as a substitutional dopant in the lattice of crystal boule 130. For example, a dopant atom of Ce may occupy a lattice position normally occupied by an Lu atom in a crystalline lattice of lutetium oxyorthosilicate.

The composition of grown rare-earth oxyorthosilicate crystal boule 130 may be described by the chemical formula $L_{2x}A_{2y}R_{2(1-x-y)}SiO_5$. In this formula, R represents the first rare-earth element, for example lutetium; L represents the second rare-earth element distinct from the first rare-earth element that may act as a dopant, for example cerium (Ce); and A represents a group 7 element, Rare-earth dopant L is described further below. The symbols x and y represent atomic fractions in the crystal of the second rare-earth element and the group 7 element, respectively. Values of x and y may be set by selecting an amount of the second substance and an amount of the third substance to be included in the melt.

Alternatively, R may represent a mixture of at least one rare-earth element and at least one additional element distinct from the first rare-earth element, in any combination. The additional element or elements may be lutetium (Lu), lanthanum (La), gadolinium (Gd), or yttrium (Y) in any combination. In this case, R represents the sum total of these of the at least one rare-earth element and the additional elements. For example, R may represent a mixture of 90% Lu and 10% Y. This mixture then accounts for an atomic fraction in the boule given by (1-x-y), according to the formula above. The elements making up this mixture may be distinguished from other elements in the crystal based on the positions they occupy in a unit cell of the crystal lattice.

Alternatively, A in the above formula may represent a mixture of group 7 elements and at least one group 2 element, such as Be, Mg, Ca, Sr, and Ba. In this case, the subscript "y" in the above formula indicates an atomic fraction of the mixture in the crystal, not an atomic fraction of one element. The elements making up this mixture may be distinguished from other elements in the crystal based on the positions they occupy in a unit cell of the crystal lattice.

Alternatively, L may represent a mixture of two or more second rare-earth elements.

The value of x may be zero, that is, a second rare-earth element L may be absent. The range of x may be $0.00001 \leq x \leq 0.1$. This range of x may also be expressed in terms of atomic percent of element L as 0.001% to 10%, inclusive. The range of y may be $0.00001 \leq y \leq 0.1$. This range of y may also be expressed in terms of atomic percent of element A as 0.001% to 10%, inclusive. Alternatively, the ranges for both x and y may be $0.00005 \leq x,y \leq 0.015$ which may also be expressed as from 0.005% to 1.5%, inclusive. Alternatively, the range of x and the range of y, expressed in the percentage form, may each be independently restricted to being between any two integer multiples of 0.001%, including those two multiples of 0.001%, within a range from 0.1% to 10%, including 0.1% and 10%. The substance including group 7 element 150 may be an oxide of that element. It may a sulfate or a sulfite. It may be a nitrate or a nitrite. It may be a phosphate or a phosphite. It may be an oxyhalide, a carbonate, or a hydroxide. The substance including group 7 element 150 may yield an oxygen-containing anion of the element from group 7 upon thermal decomposition at temperatures such as those occurring in the melt.

Figure 2:
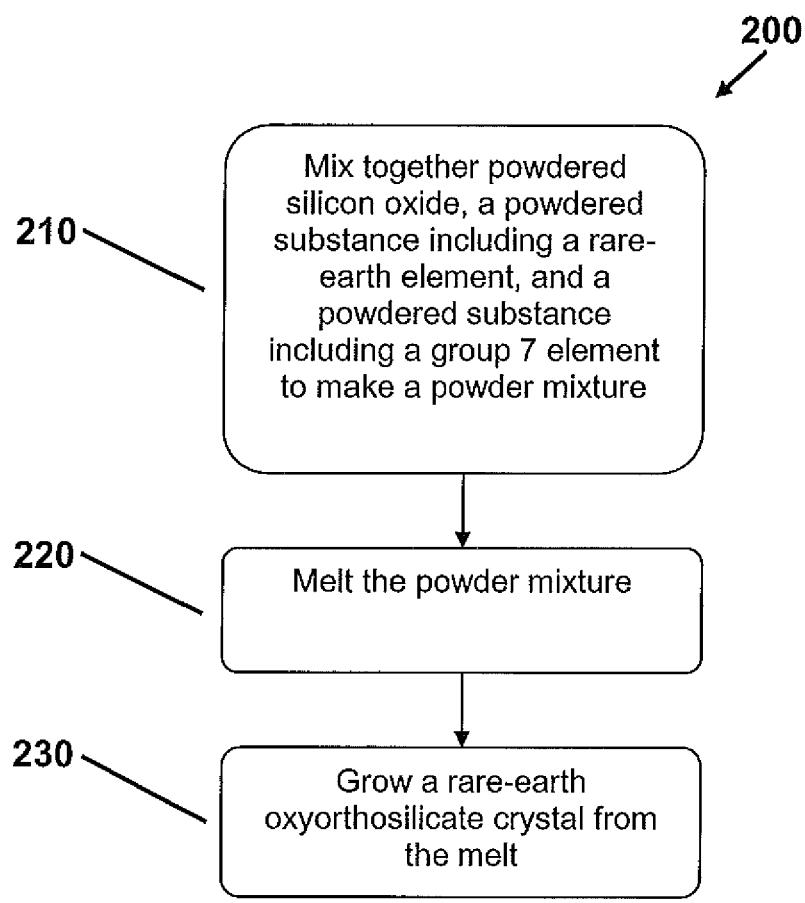
FIG. 2 is an example flow chart showing a method for growing a crystal.

FIG. 2 shows an embodiment, not to be considered limiting, of a method for introducing at least one group 7 element 150 into melt 145. As illustrated in FIG. 2, a powdered substance comprising a first rare-earth element may be mixed with a powdered silicon oxide such as silica ($SiO_2$) 210. A powdered substance that includes a group 7 element is added to make a powder mixture 210. The powdered substance comprising a first rare-earth element may be a rare-earth oxide or a mixture of such oxides, such as $Lu_2O_8$, $Gd_2O_8$ or $La_2O_3$, or a mixture thereof. An oxide of an additional element, such as $Y_2O_3$, may also be added 210. The group 7 element may be, but is not limited to, manganese or rhenium. In addition, one or more substances including at least one element from group 2 of the periodic table may be introduced into the mixture at step 210. The addition of group 2 elements may contribute stabilizing growth of the crystal. A second powdered substance comprising a second rare-earth element may be mixed with the powder mixture at step 210. The second powdered substance may be a rare-earth oxide or any rare-earth compound including an oxygen moiety. As an example, a powdered substance including cerium, such as a cerium oxide $CeO_2$ may be introduced into the powder mixture for the purpose of growing an oxyorthosilicate crystal doped with cerium as a scintillator crystal.

In step 220 the powder mixture is melted in crucible 135 to produce melt 145. In step 230 a rare-earth oxyorthosilicate crystal is grown from melt 145.

The embodiment illustrated in FIG. 2 includes the use of powders for the silicon oxide, for a substance comprising at least one first rare-earth element, for a substance comprising at least one group 7 element, and, optionally, a substance comprising at least one second rare-earth element and a substance comprising at least one group 2 element. Another embodiment includes use of different forms of matter for some or all of these example substances, including, but not limited to, liquids, sintered substances, granulated substances, pressed tablets, or solids that are not powdered.

Figure 3A:
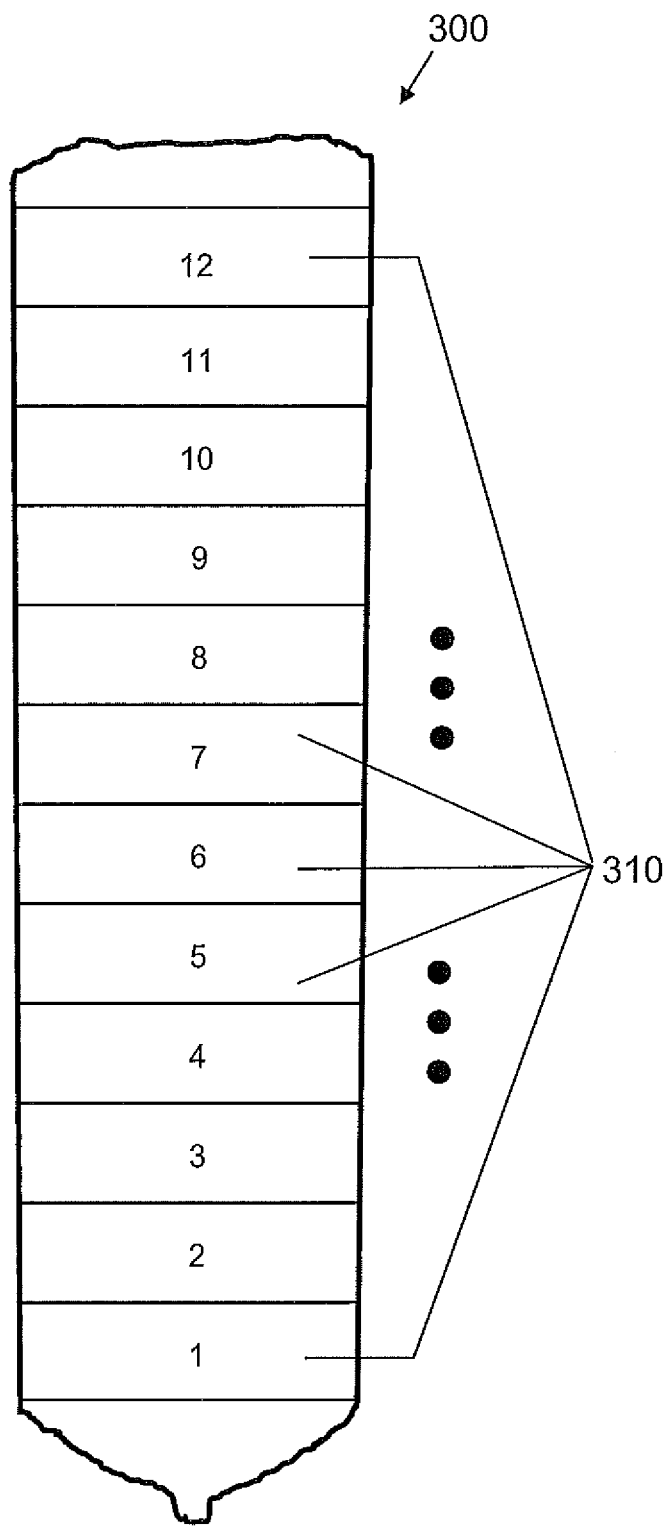
FIG. 3a shows an example crystal boule.

FIG. 3a shows an example of a crystal boule 300 grown according to a method described above. To evaluate the scintillation properties of crystals made by the method illustrated in FIG. 2, boules were cut into multiple samples (slabs) and each sample was evaluated separately. FIG. 3 shows a boule cut into twelve samples 310. Sample 1 is taken from the bottom of the boule, that is, the last part of the boule to be grown. Sample 12 is taken from the top of the boule, that is, the first section to be grown.

Figure 3B:
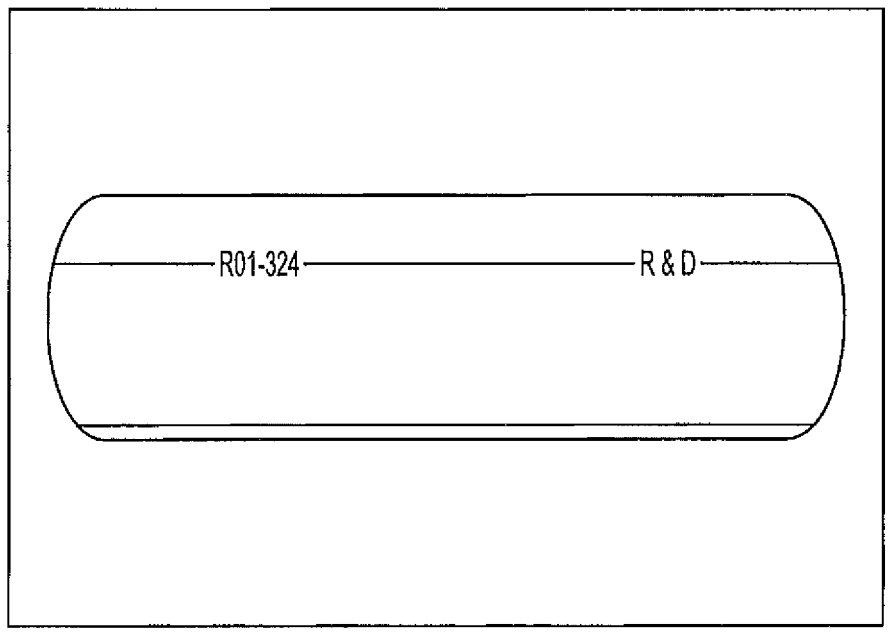
FIG. 3b shows an image of a crystal boule.

FIG. 3b shows a photograph of a crystal grown according to a method described above. The crystal is lutetium oxyorthosilicate (LSO) grown with, and incorporating, Mn. The boule has a cylindrical shape with a nearly constant diameter along its length, except near the two ends, with no indication of spiral growth patterns or cracking. This is evidence of a stable growth process.

Oxyorthosilicate crystals may be grown over the following ranges of conditions: temperature from 1900° C. to 2200° C. inclusive, withdrawal rates from 0.001 mm/hr to 10 mm/hr inclusive, and rotation rates from 0 to 100 rotations per minute (RPM), inclusive. These ranges are exemplary and under the methods described herein any one or more of these conditions may be varied within or outside these ranges as known in the art. Oxyorthosilicate crystals may be grown over ranges of temperature, withdrawal rate, and rotation rate that are restricted to being between any two integer values, and including those integer values, within the above ranges.

Exemplary cerium-doped lutetium oxyorthosilicate scintillator crystal boules were grown according to an embodiment of the method described above. For these exemplary boules, growth conditions were set as follows: melt temperature about 2100° C., withdrawal rate 3 min/hr, and rotation rate 1 RPM. The crystals were grown in an atmosphere containing about 1% oxygen in nitrogen. The crystals were grown to about 80 mm in diameter and about 240 mm in length. The slabs were 20 mm in thickness and were cut and numbered, starting from the bottom section of the crystal boule as shown in FIG. 3a. Light output measurements were done under excitation with $Cs^{137}$ gamma source (662 keV). The scintillation light was collected using a Hamamatsu R877 photomultiplier.

Table 1 shows light output and energy resolution of a scintillator crystal grown with addition of an oxide of manganese to the melt. By contrast, Table 2 shows corresponding data for a crystal grown in the same manner except without the addition of a substance including a group 7 element. In both Tables 1 and 2 the results are presented using arbitrary scales define by numbers of channels of a Multichannel Analyzer (MCA) unit used in the measurements. A bismuth germinate crystal ($Bi_4Ge_2O_{12}$; BGO) was used as a reference. (BGO photopeak was set to the channel 100 position). As shown by comparison of Tables 1 and 2, the crystal grown with the group 7 element shows significantly better uniformity of light emission from top to bottom of the boule; higher overall light output, which indicates more efficient scintillation process; and better energy resolution.

TABLE 1

| Slab # (With group 7 element) | Thickness (mm) | Light Output (Arbitrary units) | Energy Resolution (%) |
| --- | --- | --- | --- |
| 1 | 20 | 604 | 11 |
| 2 | 20 | 611 | 11 |
| 3 | 20 | 616 | 13 |
| 4 | 20 | 610 | 13 |
| 5 | 20 | 629 | 13 |
| 6 | 20 | 621 | 14 |
| 7 | 20 | 618 | 13 |
| 8 | 20 | 599 | 13 |
| 9 | 20 | 606 | 16 |
| 10 | 20 | 596 | 16 |
| 11 | 20 | 613 | 14 |
| 12 | 20 | 589 | 20 |

TABLE 2

| Slab # (Without group 7 element) | Thickness (mm) | Light Output (Arbitrary units) | Energy Resolution (%) |
| --- | --- | --- | --- |
| 1 | 20 | 497 | 20 |
| 2 | 20 | 489 | 18 |
| 3 | 20 | 520 | 17 |
| 4 | 20 | 543 | 18 |
| 5 | 20 | 548 | 23 |
| 6 | 20 | 591 | 19 |
| 7 | 20 | 567 | 18 |
| 8 | 20 | 584 | 17 |
| 9 | 20 | 590 | 16 |
| 10 | 20 | 621 | 13 |
| 11 | 20 | 631 | 16 |
| 12 | 20 | 633 | 15 |

In other studies, wavelength spectra were obtained of emitted light from samples of cerium-doped lutetium oxyorthosilicate crystals grown with the addition of a substance including Mn to the melt. In one such study, the crystals were excited with 35 kV x-rays; in another they were excited with light of wavelengths in the range 240-380 nm. In both studies, the shapes of the emission spectra were indistinguishable from the shapes of equivalent emission spectra obtained from cerium-doped lutetium oxyorthosilicate crystals grown without the addition of a group 7 element to the melt.

Figure 4:
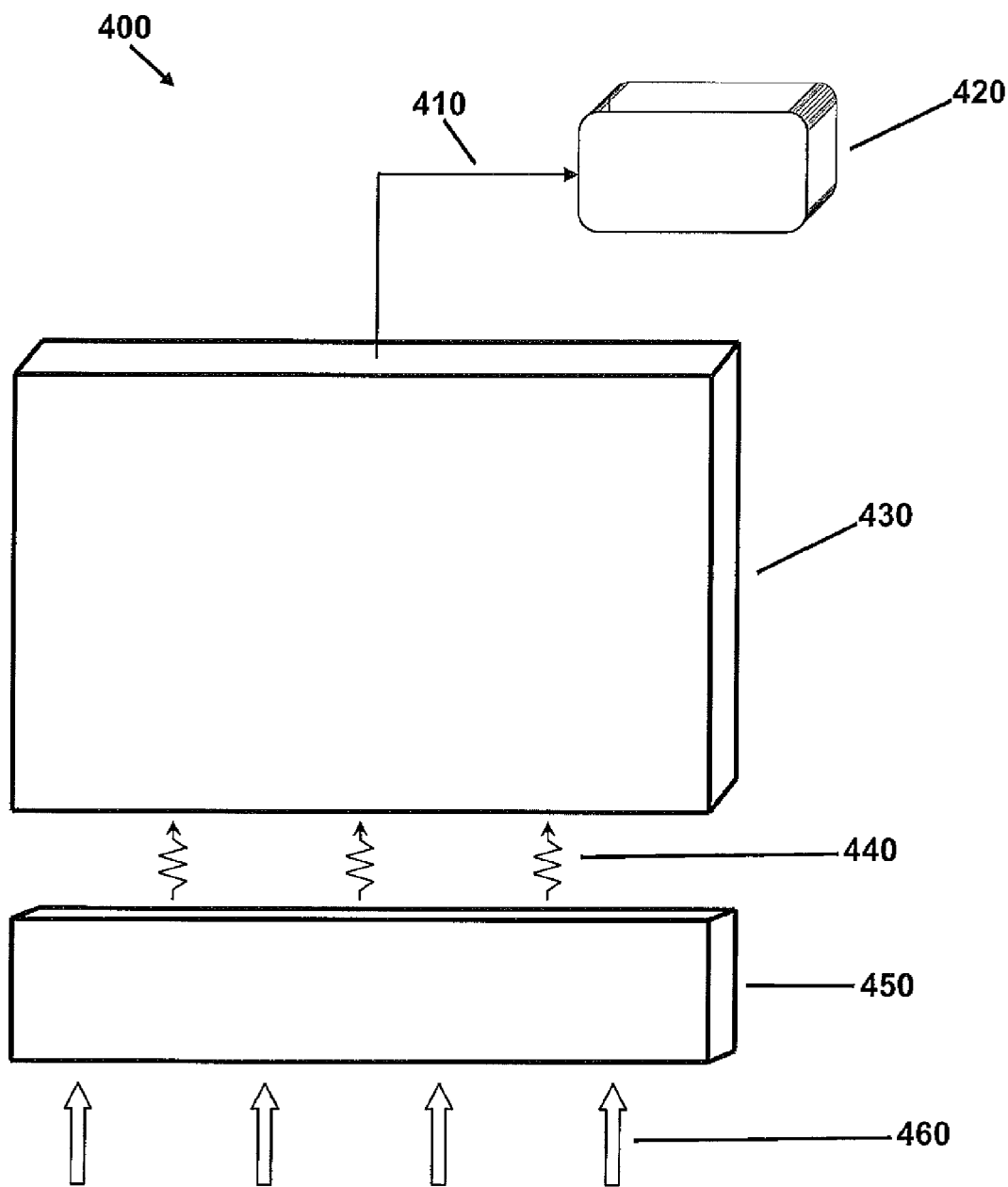
FIG. 4 shows an example of a scintillation counter.

FIG. 4 shows a scintillation counter 400 using as a detector a rare-earth oxyorthosilicate crystal 450 grown according to the method described above. Radiation 460, such as gamma photons, are absorbed by oxyorthosilicate crystal 450, resulting in emission of scintillation light 440 from oxyorthosilicate crystal 450. Scintillation light 440 is detected by light detector 430, such as a photomultiplier tube or any other light sensor. An electrical signal produced by light detector 430 is conveyed by electrical connection 410 to analyzing electronics 420. Information such as energy spectra and timing of radiation 460 may be extracted using analyzing electronics 420.

While the preceding description refers to certain embodiments, it should be recognized that the description is not limited to those embodiments. Rather, many modifications and variations may occur to a person of ordinary skill in the art which would not depart from the scope and spirit defined in the appended claims.

What is claimed is:

1. A composition comprising a rare-earth oxyorthosilicate crystal having a composition described by $L_2A_{2y}R_{2(1-x-y)}SiO_5$, where R represents at least one first rare-earth element, L represents at least one second rare-earth element, A represents at least one group 7 element and optionally at least one group 2 element, $0<x\le 10\%$ and $0<y\le 10\%$, and $0.005\le (y/x)\le 5.0$, the crystal being made by a process comprising:
   preparing a melt by:
      melting a first substance comprising at least one first rare-earth element; and
      melting a second substance comprising at least one element from group 7 of the periodic table;
      melting a substance comprising silicon;
   providing a seed crystal;
   contacting the surface of the melt with the seed crystal;
   withdrawing the seed crystal from the melt to obtain a crystal boule; and
   obtaining from the boule a crystal.

2. The composition of claim 1, wherein preparing a melt further comprises melting a fourth substance comprising at least one additional element distinct from the at least one first rare-earth element.

3. The composition of claim 2, wherein the at least one additional element is selected from the group consisting of lutetium, gadolinium, lanthanum, and yttrium.

4. The composition of claim 2, wherein preparing a melt further comprises melting a fifth substance comprising at least one element from group 2 of the periodic table.

5. The composition of claim 1, wherein the at least one first rare-earth element is lutetium.

6. The composition of claim 1, wherein the at least one second rare-earth element is cerium.

7. A material comprising a scintillation crystal with a composition described by $L_{2x}A_{2y}R_{2(1-x-y)}SiO_5$, where R represents at least one first rare-earth element, L represents at least one second rare-earth element distinct from the first rare-earth element, A represents at least one group 7 element, wherein $0.00001\le x\le 0.1$; and $0.00001\le y\le 0.1$.

8. The material of claim 7, wherein R represents a mixture of the first rare earth element and at least one additional element distinct from the first rare-earth element.

9. The material of claim 8, wherein the at least one additional element is selected from the group consisting of lutetium, gadolinium, lanthanum, or yttrium.

10. The material of claim 7, wherein A represents a mixture of the at least one group 7 element with at least one element from group 2 of the periodic table.

11. A material comprising a scintillation crystal with a composition described by $L_{2x}A_{2y}R_{2(1-x-y)}SiO_5$ where R resents at least one first rare-earth element, L represents at least one second rare-earth element distinct from the first rare-earth element, A represents at least one group 7 element $0<x\le10\%$, $0<y\le10\%$, and $0.005\le(y/x)\le5.0$.

12. A single crystal scintillation material with a composition described by $L_2A_{2y}B_zR_{2(1-x-y)}SiO_5$, where R represents at least one first rare-earth element, L represents at least one second rare-earth element distinct from the first rare-earth element, A represents at least one group 7 element and includes manganese, B represents at least one element from group 2 of the periodic table of element, $0<x\le10\%$, $0<y\le10\%$, $z\ge0$ and $0.005\le(y/x)\le5.0$.

13. The material of claim 12, wherein $z>0$.

14. The material of claim 13, wherein B is one or more of Mg, Ca and Sr.

15. The material of claim 12, wherein R is lutetium, L is cerium, A is Mn.

16. The composition of claim 1, where in the at least one group-7 element comprises manganese.

17. The composition of claim 5, where in the at least one group-7 element comprises manganese.

18. The composition of claim 6, where in the at least one group-7 element comprises manganese.

19. The material of claim 7, where in the at least one group-7 element comprises manganese.

20. The material of claim 19, wherein the at least one second rare-earth element comprises cerium.

* * * * *